United States Patent [19]

Kobayashi et al.

[11] Patent Number: 5,315,100

[45] Date of Patent: May 24, 1994

[54] PHOTOELECTRIC CONVERSION APPARATUS FOR DETECTING MOVEMENT OF OBJECT WITH SPATIAL FILTER ELECTRODE

[75] Inventors: Akira Kobayashi; Takeshi Kawai; Hiroshi Sasaki, all of Kanagawa, Japan

[73] Assignee: Yamatake-Honeywell Co., Ltd., Tokyo, Japan

[21] Appl. No.: 978,756

[22] Filed: Nov. 18, 1992

[30] Foreign Application Priority Data

Nov. 19, 1991 [JP] Japan .................. 3-329835

[51] Int. Cl.⁵ ............................................. H01J 40/14
[52] U.S. Cl. ........................ 250/208.1; 250/550; 250/221
[58] Field of Search ............ 250/221, 208.1, 214.1, 250/550; 257/448, 53; 340/555; 358/105, 113

[56] References Cited

U.S. PATENT DOCUMENTS

| | | | |
|---|---|---|---|
| 3,993,976 | 11/1976 | Ginsburg | 250/550 |
| 4,063,281 | 12/1977 | Kornreich et al. | 340/555 |
| 4,520,343 | 5/1985 | Koh et al. | 250/221 |
| 4,554,459 | 11/1985 | Tsutsumi et al. | 250/550 |
| 4,717,946 | 1/1988 | Godfrey | 257/448 |
| 4,873,469 | 10/1989 | Young et al. | 250/221 |
| 5,130,775 | 7/1992 | Maeda et al. | 257/53 |
| 5,149,980 | 9/1992 | Ertel et al. | 358/105 |

FOREIGN PATENT DOCUMENTS

| | | | |
|---|---|---|---|
| 56-39429 | 9/1981 | Japan . | |
| 0154190 | 6/1990 | Japan | 340/555 |

*Primary Examiner*—David C. Nelms
*Attorney, Agent, or Firm*—Blakely, Sokoloff, Taylor & Zafman

[57] ABSTRACT

A photoelectric conversion apparatus includes a pair of opposite electrodes, and an amorphous silicon film. The amorphous silicon film is sandwiched between the pair of opposite electrodes and serves to perform photoelectric conversion of light including light from a target object. At least one of the pair of opposite electrodes is divided into a set of pattern electrodes respectively connected to the amorphous silicon film in electrically positive and negative directions so as to form a spatial filter electrode. The respective pattern electrodes respectively connected in the positive and negative directions are irregularly arranged on the amorphous silicon film.

4 Claims, 4 Drawing Sheets

PHOTOELECTRIC CONVERSION APPARATUS FOR DETECTING MOVEMENT OF OBJECT WITH SPATIAL FILTER ELECTRODE

BACKGROUND OF THE INVENTION

The present invention relates to a photoelectric conversion apparatus for detecting the movement of an object.

As a conventional photoelectric conversion apparatus of this type, for example, Japanese Patent Publication No. 56-39429 discloses a photoelectric conversion apparatus for detecting the movement of an object, in which a large number of photoelectric conversion elements are connected in electrically positive and negative directions such that the elements connected in the positive and negative directions repeatedly appear on a plane in the longitudinal and lateral directions, and the sum of outputs from the photoelectric conversion elements in the positive direction and the sum of outputs from the photoelectric conversion elements in the negative direction are differentially connected to each other. With this arrangement, when an object to be detected is at rest, the two element outputs cancel each other, and hence no differential output is transmitted. When the object moves, pulse-like differential outputs are periodically output so that a detection output having a frequency corresponding to the moving speed of the object can be obtained.

In the above-described conventional photoelectric conversion apparatus, however, if photoelectric conversion elements and spatial filters for detecting the movement of a target object are integrally manufactured by using monocrystalline silicon members as photoelectric conversion components, an element formation process demands a large number of steps such as diffusion and etching. In addition, if such apparatuses are manufactured to have large areas, a reduction in yield is caused, resulting in an increase in cost. Furthermore, when active elements used for signal processing are integrated on a monocrystalline silicon layer, the portion on which the elements are formed cannot be used as a portion having light sensitivity.

SUMMARY OF THE INVENTION

It is an object of the present invention to provide a photoelectric conversion apparatus for detecting the movement of an object, which has a simple arrangement and can be realized at a low cost.

It is another object of the present invention to provide a photoelectric conversion apparatus for detecting the movement of an object, in which a photoelectric conversion element and a spatial filter are integrated.

In order to achieve the above objects, according to the present invention, there is provided a photoelectric conversion apparatus comprising a pair of opposite electrodes, and an amorphous silicon film, sandwiched between the pair of opposite electrodes, for performing photoelectric conversion of light including light from a target object, wherein at least one of the pair of opposite electrodes is divided into a set of pattern electrodes respectively connected to the amorphous silicon film in electrically positive and negative directions so as to form a spatial filter electrode, and the respective pattern electrodes respectively connected in the positive and negative directions are irregularly arranged on the amorphous silicon film.

DESCRIPTION OF THE PREFERRED EMBODIMENTS

Embodiments of the present invention will be described in detail below with reference to the accompanying drawings.

Figure 1:
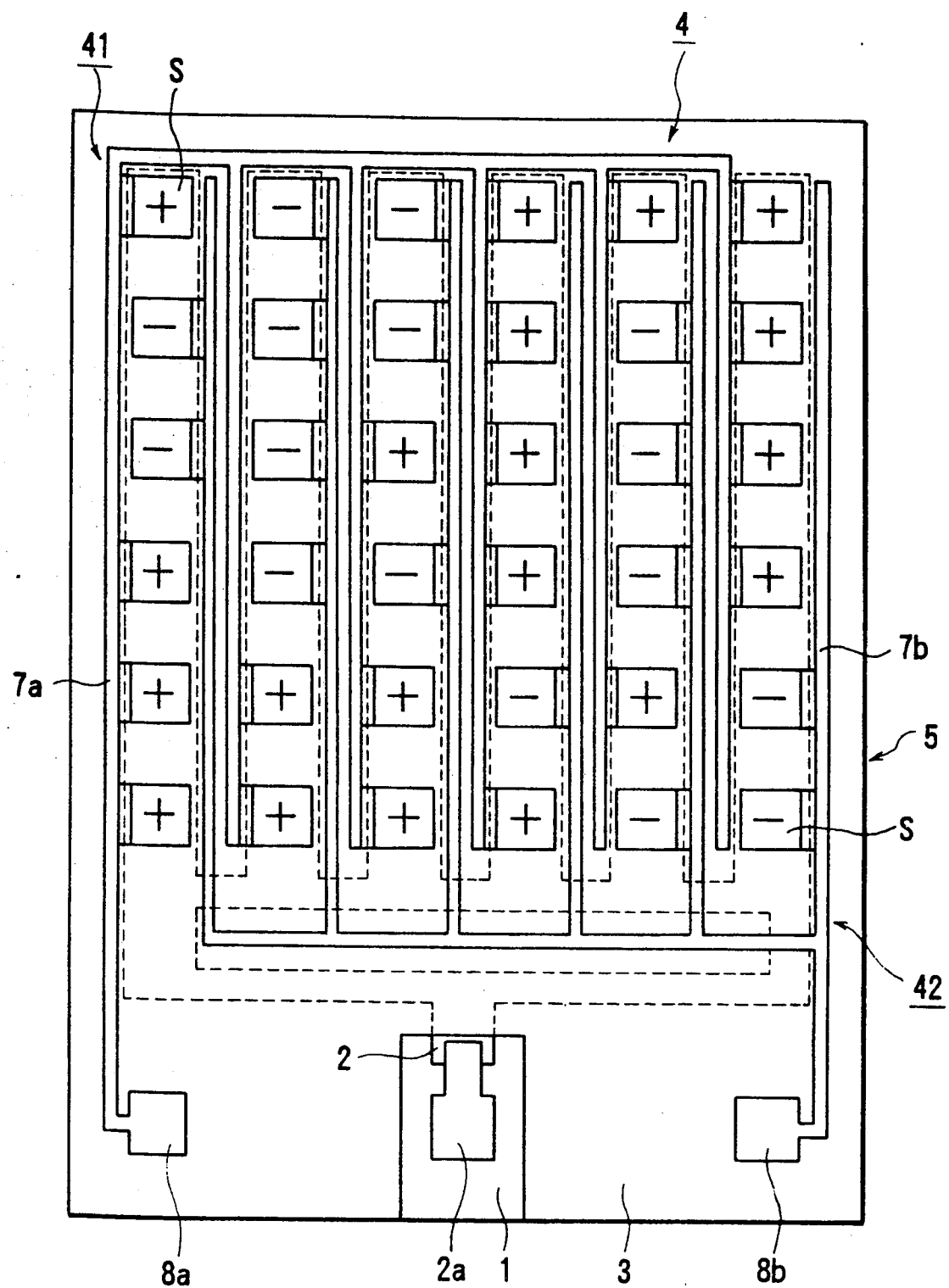
FIG. 1 is a plan view showing the arrangement of a photoelectric conversion apparatus according to an embodiment of the present invention.
Figure 2:
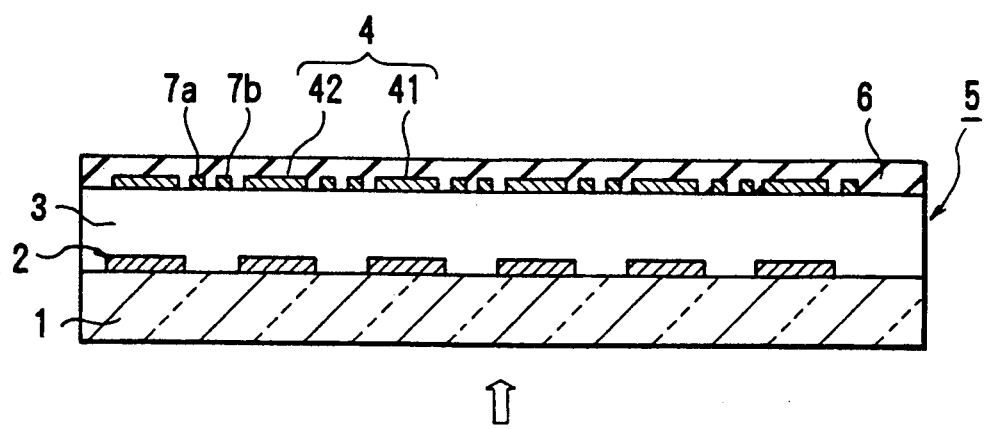
FIG. 2 is a sectional view showing the main part of the apparatus in FIG. 1.

FIGS. 1 and 2 show the arrangement of a photoelectric conversion apparatus according to an embodiment of the present invention. Referring to FIGS. 1 and 2, reference numeral 1 denotes a transparent glass substrate; 2, a common electrode constituted by a transparent conductive film and formed on the glass substrate 1; 2a, an electrode terminal of the common electrode 2; 3, a pin type amorphous silicon film formed, as a photoelectric conversion film, on the common electrode 2; and 4, an interdigital electrode formed on the surface of the amorphous silicon film 3 to oppose the common electrode 2 and having a spatial filter function. The interdigital electrode 4 is formed such that a thin metal film consisting of Al, Cr, or the like is formed on the surface of the amorphous silicon film 3, and the resultant structure is patterned into a predetermined shape to have the function of a spatial filter. The amorphous silicon film 3 is sandwiched between the common electrode 2 and the interdigital electrode 4 to form a photoelectric conversion element 5 constituting a spatial filter. Reference numeral 6 denotes a surface protection film.

As shown in FIG. 1, the interdigital electrode 4 is constituted by first and second comb electrodes 41 and 42 having a plurality of rectangular comb teeth so as to have a spatial filter function. The rectangular comb teeth of the first and second comb electrodes 41 and 42 are properly distributed and combined together to oppose each other at a predetermined pitch. The first and second comb electrodes 41 and 42 are arranged to oppose the common electrode 2 formed on the glass substrate 1. In addition, the rectangular comb teeth of the first and second comb electrodes 41 and 42 are electrically connected to conductive wires 7a and 7b, respectively, and are extracted to be respectively connected to an electrode terminal 8a and an electrode terminal 8b. Note that the common electrode 2 described above is not disposed at portions below the conductive wires 7a and 7b. In addition, the electrode terminal 2a of the common electrode 2 is obtained by forming a thin metal film consisting of Al, Cr, or the like on the surface of the transparent conductive film constituting the common electrode 2.

In this spatial filter, for example, 20 (longitudinal direction) ×26 (lateral direction) cells S, i.e., a total of 520 cells S, are weighted by using random numbers or pseudo-random numbers so that "+1s" and "−1s" are irregularly arranged, as shown in FIG. 1. In this case, for example, an M series is used and two-dimensionally developed as pseudo-random numbers. Note that the sum total of the weights of the cells S is set to be almost "0". Even if the sum total of the weights is not "0", the absolute value of the sum total needs to be 10% or less of the sum of the absolute values of the weights of all the cells S. When autocorrelation of a two-dimensional array of weights, which array serves as a spatial filter, is calculated, a peak is present at only one point, and irregularities are established in two dimensions. Note that the number of peaks must not exceed 4 at worst.

In this arrangement, the amorphous silicon film 3 is sandwiched between the common electrode 2 and the interdigital electrode 4 to constitute the photovoltaic type photoelectric conversion element 5, while the spatial filter is constituted by the first and second comb electrodes 41 and 42 of the interdigital electrode 4. With this arrangement, when an image of, e.g., a man as a target object is incident from the glass substrate 1 side in the direction indicated by the arrow in FIG. 1, the image is projected on the photoelectric conversion element 5. As a result, most of the current flowing in the amorphous silicon film 3 flows in the longitudinal direction in which an internal electric field is generated owing to the pin structure, because the insulating performance of the film 3 is higher in the lateral direction than in the longitudinal direction. Therefore, signals extracted from the electrode terminals 8a and 8b correspond to light components projected on the first and second comb electrodes 41 and 42, respectively.

Figure 3:
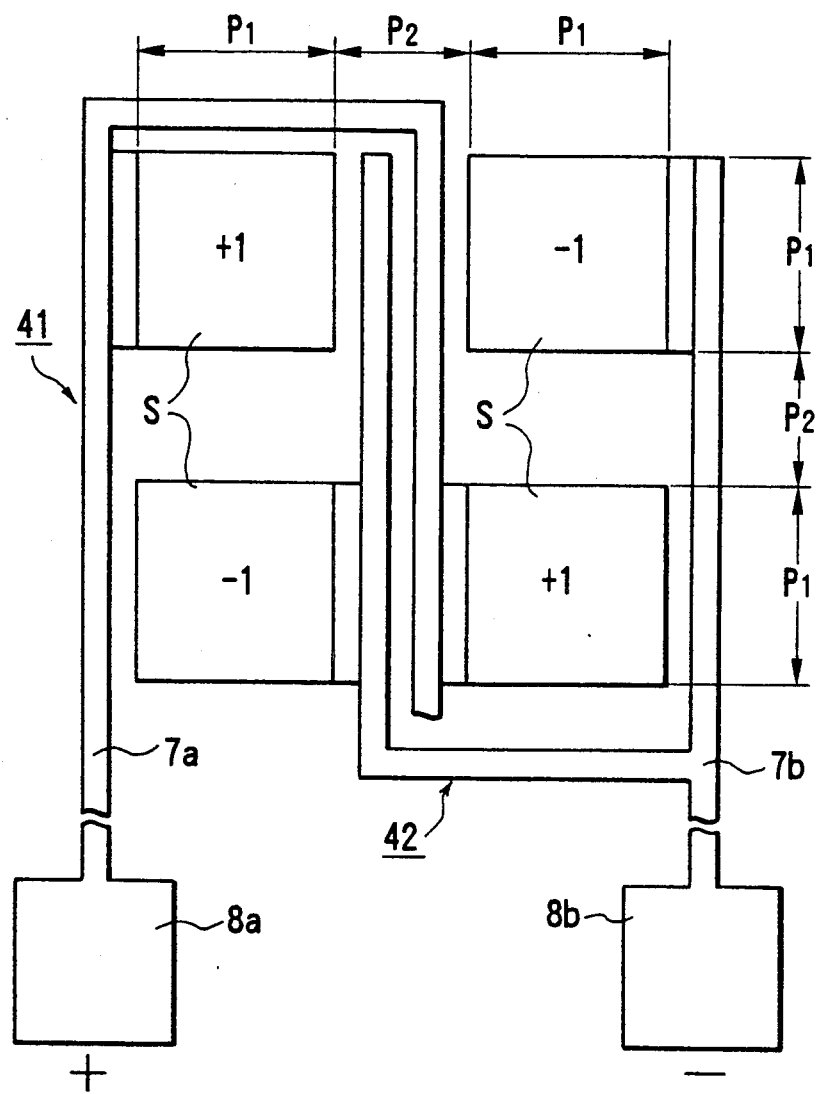
FIG. 3 is an enlarged plan view showing the arrangement of the main part of an interdigital electrode.

In the spatial filter, as shown in FIG. 3, the respective rectangular comb teeth constitute the cells S, each having light sensitivity. A pitch $P_1$ of each cell S is 380 μm, and a pitch $P_2$ between the respective cells S is 140 μm. In this case, the ratio of the pitch $P_1$ to the pitch $P_2$ is set to be 0.4 or less. The first and second comb electrodes 41 and 42 constitute the cells in the form of a 20 (longitudinal direction) ×26 (lateral direction) matrix are respectively weighted by "+1" and "−1", and are connected to the electrode terminals 8a and 8b, respectively. Finally, all outputs are integrated into outputs "+1" and "−1", and an output signal can be obtained depending on whether the outputs are connected to the input terminals of the signal processing circuit shown in FIG. 4.

Figure 4:
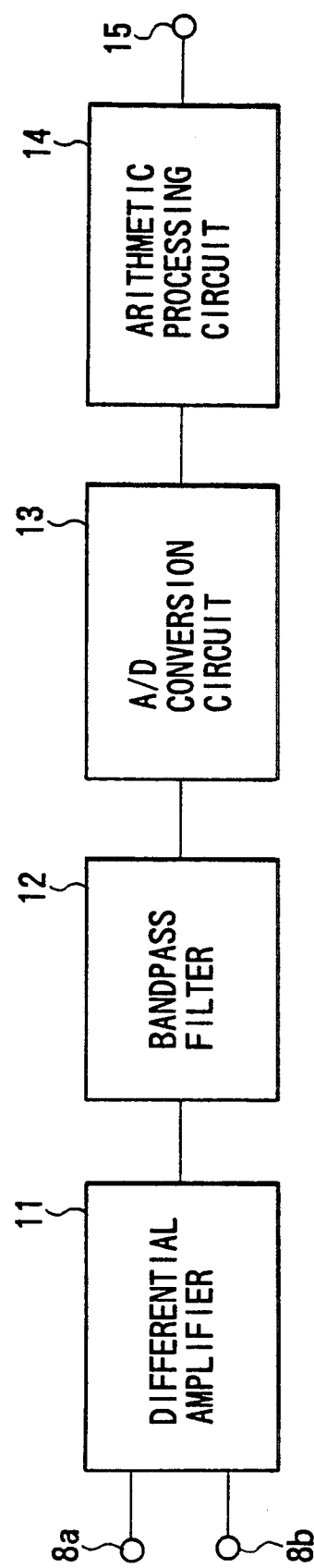
FIG. 4 is a block diagram showing a signal processing circuit for a photoelectric conversion element.

FIG. 4 shows the signal processing circuit for the photoelectric conversion element 5 shown in FIGS. 1 and 2. Referring to FIG. 4, reference numeral 11 denotes a differential amplifier; 12, a bandpass filter; 13, an A/D conversion circuit; and 14, an arithmetic processing circuit.

When outputs from the first and second comb electrodes 41 and 42 are input to the differential amplifier 11 through the electrode terminals 8a and 8b, respectively, the difference between the outputs is amplified. If, for example, a human image projected on the photoelectric conversion element 5 moves by a distance twice the pitch of the cell S, i.e., 2×(electrode width $P_1$+interelectrode width $P_2$), a brightness change corresponding to one period occurs and is converted into an electrical signal by the photoelectric conversion element 5. Note that the frequency of this electrical signal is determined by the moving speed of the man. The signal is input to the bandpass filter 12. The bandpass filter 12 allows the signal frequency based on the target man who is moving to pass through. An output from the bandpass filter 12 is A/D-converted by the A/D conversion circuit 14, and the resultant signal is output to the arithmetic processing circuit 14. The arithmetic processing circuit 14 calculates, for example, an autocorrelation function to calculate the moving speed of the moving object. An output signal from the arithmetic processing circuit 14 is output, as a signal corresponding to the number and movement of moving objects, to an output terminal 15. For example, this output signal can be used as a motion monitoring signal for a living creature which irregularly moves.

Figure 5:
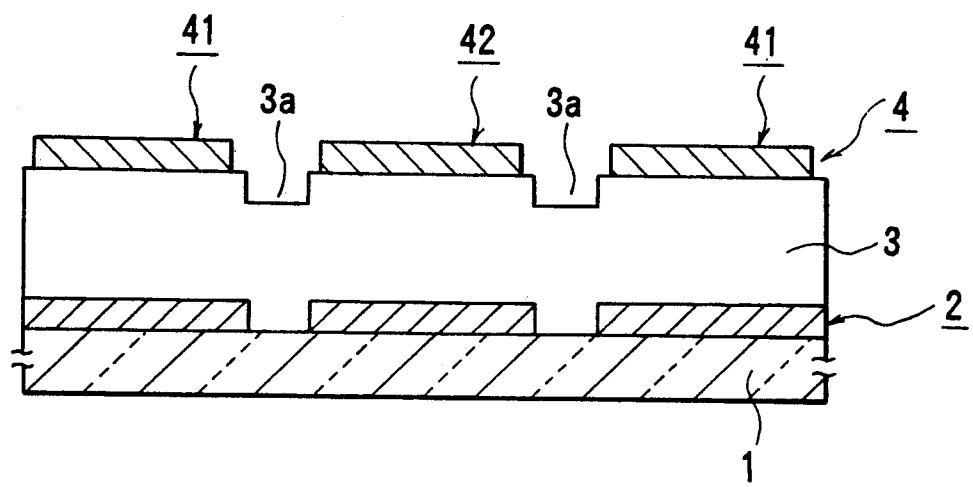
FIG. 5 is an enlarged plan view showing the arrangement of the main part of a photoelectric conversion element.

In the above-described embodiment, when the first and second comb electrodes 41 and 42 are to be formed on the amorphous silicon film 3, dark currents flowing in the photoelectric conversion element 5 can be reduced by etching an n-type layer of the amorphous silicon film 3 at positions between the respective electrodes to form recess portions 3a, as shown in FIG. 5.

In the above embodiment, the respective cells of the spatial filter are weighted by "+1" and "−1". However, the cells S may be weighted by "+1", "−1", and "0", and these weighted cells S are irregularly arranged so that outputs from the cells S weighted with the same coefficient are integrated into one output, and an output signal can be obtained depending on whether the output is connected to the signal processing circuit.

In the above embodiment, the photoelectric conversion element 5 has the common electrode 2 on the transparent glass substrate 1 side. However, the same effect as described above can be obtained even if the interdigital electrode 4 having the spatial filter function is arranged on the glass substrate 1 side. In addition, the same effect as described above can be obtained by the following arrangement. A metal substrate is used in place of the transparent glass substrate 1, and an insulating film is formed on the surface of the metal substrate. A photoelectric conversion element 5 is formed on the insulating film. In this case, light from a target object is incident from the opposite side of the metal substrate, i.e., incident downward on the photoelectric conversion element 5.

Figure 6:
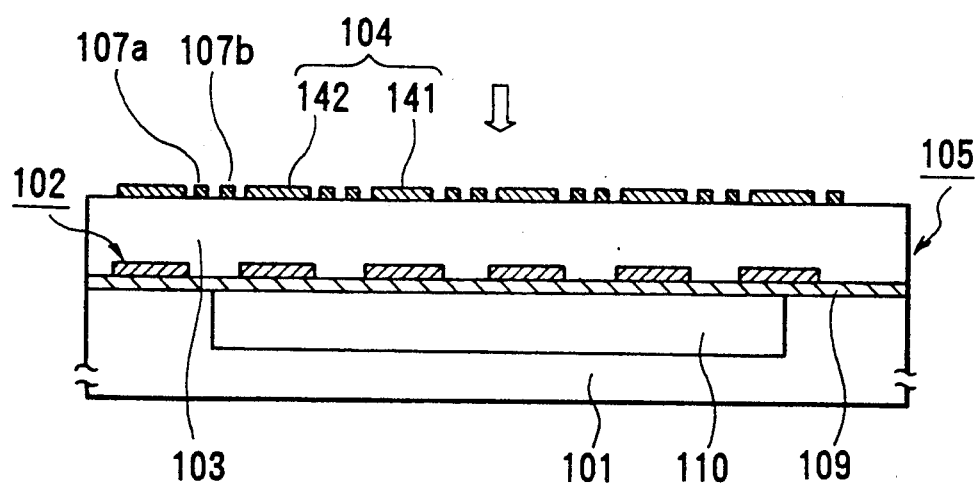
FIG. 6 is a sectional view showing the main part of another embodiment of the present invention.

FIG. 6 shows the main part of another embodiment of the present invention. In the embodiment shown in FIG. 2, the photoelectric conversion element 5 is formed on the glass substrate 1. A silicon substrate 101 is used in place of the glass substrate. An amorphous silicon film 103 is formed on the silicon substrate 101 through an insulating film 109, and light from a target object is caused to be incident downward on a photoelectric conversion element 105, as described above. In addition, the above-described signal processing circuit shown in FIG. 4 is formed, as an integrated circuit 110, on the silicon substrate 101. In this embodiment, since a spatial filter is formed on the silicon substrate 101 on which the integrated circuit 110 is formed, almost the entire surface of the photoelectric conversion element 105 can be used as a spatial filter region having light sensitivity without sacrificing a photodetection region of the element 105.

As has been described above, according to the present invention, since a spacial filter having irregularity and a photoelectric conversion element having an amorphous silicon film are integrally formed, the design of an optical system is greatly facilitated, and a simple arrangement can be realized, thereby providing a large-size photoelectric conversion apparatus at a low cost. In addition, since the amorphous silicon film is used, a spatial filter element having a large area can be realized at a low cost. Furthermore, since the spatial filter has irregularity, the movements of objects within the field of view can be detected regardless of the moving directions of the objects. In addition, cancellation between the movements of objects in difference places within the field of view is reduced so that independency of each place can be ensured, and a clear frequency signal based on the movement of each target object can be obtained. Moreover, since an amorphous silicon film can be formed at a low temperature, the film can be formed on a silicon substrate. Therefore, the respective components including the signal processing circuit can be integrated.

What is claimed is:

1. A photoelectric conversion apparatus for performing photoelectric conversion of light from a target object to detect movement of said target object, comprising:

a pair of opposite electrodes, at least one of said opposite electrodes being divided into a set of pattern electrodes, said set of pattern electrodes comprising first and second comb electrodes combined to oppose each other at a predetermined pitch and having comb teeth connected to a plurality of cell electrodes, all of said cell electrodes being formed in matrix form; and an amorphous silicon film sandwiched between said pair of opposite electrodes and connected to said set of pattern electrodes in electrically positive and negative directions so as to form a spatial filter electrode, said cell electrodes of each of said pattern electrodes being irregularly arranged on said amorphous silicon film.

2. An apparatus according to claim 1, wherein said set of pattern electrodes comprise first and second comb electrodes combined to oppose each other at a predetermined pitch and having comb teeth connected to a plurality of cell electrodes, said cell electrodes of said first and second comb electrodes being irregularly arranged.

3. An apparatus according to claim 2, wherein said irregularly arranged cell electrodes are respectively weighted in accordance with said first and second comb electrodes, and an absolute value of a sum total of weights of said cell electrodes is not more than 10% of a sum of absolute values of the weights of all said cells.

4. An apparatus according to claim 1, further comprising an integrated circuit for processing signals output from said pair of opposite electrodes which is formed on a silicon substrate on which said amorphous silicon film is formed.

* * * * *